United States Patent [19]

Sutton et al.

[11] 4,264,706

[45] Apr. 28, 1981

[54] DICHROMATED HYDROPHILIC COLLOID-LATEX COPOLYMER COMPOSITIONS

[75] Inventors: Richard C. Sutton; Thomas W. Martin, both of Rochester, N.Y.

[73] Assignee: Eastman Kodak Company, Rochester, N.Y.

[21] Appl. No.: 129,523

[22] Filed: Mar. 12, 1980

[51] Int. Cl.³ .................. G03C 5/00; B03F 5/00; H01J 1/52
[52] U.S. Cl. .................. 430/274; 430/199; 430/289; 430/292; 430/315; 430/324; 430/532; 430/510; 430/962
[58] Field of Search ............ 430/175, 176, 274, 289, 430/962, 533, 510, 199, 292, 315, 324

[56] References Cited

U.S. PATENT DOCUMENTS

| | | | |
|---|---|---|---|
| 2,604,388 | 7/1952 | Staehle | 41/39 |
| 2,687,958 | 8/1954 | Neugebaner | 95/7 |
| 3,284,208 | 11/1966 | Land | 96/118 |
| 4,081,277 | 3/1978 | Brault et al. | 96/38.2 |

OTHER PUBLICATIONS

Friedman, History of Color Photography, 1944, p. 147.

*Primary Examiner*—Jack P. Brammer
*Attorney, Agent, or Firm*—John R. Everett

[57] ABSTRACT

The properties of a dichromated hydrophilic colloid photosensitive composition are improved by the incorporation of certain copolymer latices. More particularly, the copolymer particles in the latex conform to the structure:

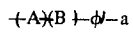

wherein A is a polymerized monomer or monomers having the structure:

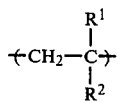

and B is a polymerized monomer or monomers having the structure:

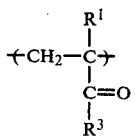

wherein
each $R^1$ is independently hydrogen or methyl;
$R^2$ is phenyl, substituted phenyl or a straight- or branched-chain alkoxycarbonyl group of about 2-8 carbon atoms;
$R^3$ is $-NR^4R^5$ or $-OR^6$ wherein $R^4$ and $R^5$ are independently selected from hydrogen, alkyl of about 1-8 carbon atoms including substituted alkyl, and alkyl containing hetero atoms in the alkyl chain, and $R^6$ is hydroxyalkyl of about 1-8 carbon atoms; and
a represents a weight percent of about 75-95.

19 Claims, No Drawings

DICHROMATED HYDROPHILIC COLLOID-LATEX COPOLYMER COMPOSITIONS

BACKGROUND OF THE INVENTION

1. Field of the Invention

The present invention relates to photosensitive compositions and the use of these compositions in forming solid-state imaging devices. More particularly, the photosensitive compositions of the present invention contain a hydrophilic colloid, e.g., gelatin, a dichromate photocrosslinking agent and a latex copolymer.

2. Discussion Relative to the Prior Art

One of the earliest known photosensitive compositions was a composition containing a natural colloid such as gelatin and a dichromate photocrosslinking agent. Exposure of this composition produces hardening of the gelatin in the exposed areas, while the unexposed areas can be easily washed away with water. This composition, which is commonly referred to as dichromated gelatin, has been used in a variety of processes. For example, a support coated with such a composition can be used as a lithographic plate.

One use for dichromated gelatin has been in the preparation of additive color screens. (See, generally, Friedman, *History of Color Photography*, American Photographic Publishing Company, 1944, chapter 13.) In a typical process for producing an additive color filter screen or color filter array, the first step is to coat a suitable support with a dichromated gelatin composition. The resulting layer is then exposed in those areas where it is desired to have the individual color filter elements, and the layer is processed to wash off unwanted areas of the gelatin layer. The resulting islands or stripes of gelatin are then dyed with a suitable dye solution to form a set of colored filter elements. This process is repeated any number of times to produce any kind of desired multicolor filter array. This process has been used to produce an additive color screen for a diffusion transfer transparency material. (See, for example, U.S. Pat. No. 3,284,208 to Land.)

Another process in which the dichromated gelatin photosensitive composition is useful is in the heat-transfer process of preparing color filter arrays. This process is described in U.S. Pat. No. 4,081,277 by Brault et al issued Mar. 28, 1978. In this process, the individual color filter elements are made by heat-transferring dye into a dye-receiving layer. The dichromated gelatin photosensitive composition is used as a photoresist. The dichromated gelatin layer is exposed to the negative of the pattern of the desired filter elements and then processed to produce window areas which correspond to the filter elements in the final array. The heat-transferable dye is then transferred through the window areas of the dichromated gelatin photoresist into the dye-receiving layer, either from dye-coated paper or a hot dye solution to form the individual filter elements.

It will be readily appreciated that, either where the dichromated gelatin photosensitive composition is to be used to form islands or stripes or where it is to be used as a negative-working photoresist, it must meet several stringent requirements. Perhaps most importantly, the dichromated gelatin photosensitive composition must have extremely high resolution. In both of the above-identified processes, the dichromated gelatin photoresist determines the resolution of the individual filter elements in the color filter array. Further, in the heat-transfer process the dichromated gelatin photosensitive composition must adhere well to the polymeric dye receiver, typically a polyester. Finally, the dichromated gelatin photosensitive composition must be reproducible.

The art suggests some ways in which the properties of simple dichromated gelatin compositions can be altered. For example, U.S. Pat. No. 2,687,958 suggests that polymeric amides of acrylic acid can be used in place of all or part of the colloid. This is said to improve uniformity of the light-sensitive layers. However, it has been found that these compositions do not adhere adequately to polyester layers.

It is known in the art to produce a dichromated gelatin photoresist which, when exposed, becomes soluble rather than insoluble. Compositions of this type include, in addition to the gelatin and dichromate sensitizer, a latex which is comprised of polymer particles which are substantially completely hydrophobic. Useful hydrophobic latices for these compositions include aqueous dispersions of poly(methyl acrylate) or poly(ethyl acrylate) or a copolymer of ethyl acrylate and acrylonitrile. Compositions of this type are disclosed in U.S. Pat. No. 2,604,388 by Staehle issued July 22, 1952. Compositions of this type, i.e., those which contain latices which are substantially hydrophobic, do not provide adequate adhesion to polyester layers.

While the dichromated gelatin photoresists of the prior art can be used in both of the processes for making color filter arrays discussed above, further improvements in the areas of resolution, adhesion and reproducibility have continued to be sought. More particularly, it would be desirable to provide a high-resolution, negative-working, dichromated gelatin photoresist which can be used directly in making color filter arrays by the "wash-off" method or which can be used in making color filter arrays using the heat-transfer process. In the latter process, it is imperative that the improved dichromated gelatin photoresist have excellent adhesion to polymeric dye-receiving layers, particularly polyester layers.

SUMMARY OF THE INVENTION

It has been found that dichromated gelatin photoresists of the negative-working type can be significantly improved by the incorporation of certain latex dispersions into the composition. More particularly, the latex dispersions which are added to the dichromated gelatin composition comprise copolymer particles which are derived from monomers which form water-insoluble homopolymers and from a small amount of certain monomers which form water-soluble homopolymers.

Still more particularly, the improved photosensitive compositions according to the present invention comprise:

(a) water;
(b) a hydrophilic colloid; and
(c) a dichromate photocrosslinking agent.

The improvement is that the photosensitive composition further comprises a copolymer latex wherein the copolymer particles conform to the structure:

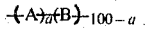

wherein A is a polymerized monomer or monomers having the structure:

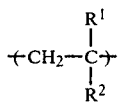

and B is a polymerized monomer or monomers having the structure:

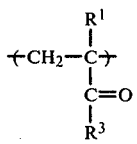

wherein:
each $R^1$ is independently hydrogen or methyl;
$R^2$ is phenyl, substituted phenyl or a straight- or branched-chain alkoxycarbonyl group of about 2–8 carbon atoms;
$R^3$ is $-NR^4R^5$ or $-OR^6$ wherein $R^4$ and $R^5$ are independently selected from hydrogen, alkyl of about 1–8 carbon atoms including substituted alkyl, and alkyl containing hetero atoms in the alkyl chain, and $R^6$ is hydroxyalkyl of about 1–8 carbon atoms; and
a represents a weight percent of about 75–95.

The photosensitive compositions described above adhere particularly well to the dye-receiving layers which are used in the heat-transfer process for making color filter arrays. Thus, in another aspect of the present invention, there is provided an article comprising a polyester layer, which can be either supported or self-supporting, having coated thereon a layer comprising the photosensitive composition described above which has been dried to remove the water. Where the polyester is on a separate support, the separate support is most preferably a solid-state imaging device whose surface comprises photosensitive elements.

Another embodiment of the present invention is a process for making a solid-state imaging device having thereon a color filter array in a dye-receiving layer. The process comprises the steps of:
(a) coating the photosensitive composition described above on the surface of the device;
(b) exposing and processing the photosensitive composition so as to produce window areas which correspond to a set of filter elements to be formed in the color filter array;
(c) heat-transferring dye into the dye receiver through the window areas; and
(d) removing the remainder of the photosensitive composition.

DETAILED DESCRIPTION OF THE INVENTION

The latex polymers which are described herein are added to conventional dichromated gelatin photosensitive compositions to improve resolution, adhesion, and the like. In addition to gelatin, many other hydrophilic colloids are useful in the photosensitive compositions of the invention. Illustrative hydrophilic colloids include fish glue, gum arabic, poly(vinyl alcohol), albumin and the like. The hydrophilic colloid is sensitized with a dichromate, preferably ammonium or sodium or potassium dichromate.

The preferred hydrophilic colloid is gelatin. Gelatin is typically made from collagen-containing materials such as bovine skin, bovine cartilage, calfskin, pigskin and the like. When gelatin is the hydrophilic colloid used, the photosensitive composition is best used at a pH which is the isoionic point of the gelatin being used. The gelatin preferably has a room-temperature viscosity of between about 10 and about 100 centipoise and is present in the coating composition at about 10 to about 25 percent by weight. Methods of preparing gelatin are well-known in the art and are described, for example by R. J. Croome and F. G. Clegg, *Photographic Gelatin,* The Focal Press, London, 1965, and A. Veis, *The Macromolecular Chemistry of Gelatin,* Academic Press, New York, 1964.

The conventional dichromated hydrophilic colloid compositions to which the described latex polymers are added optionally contain other components. Other useful components include hardeners such as aldehyde hardeners, inorganic hardeners such as chromium salts and the like; alginic acid esters such as guanidine and the like; and other components such as coating aids and the like which do not interfere with the photosensitive properties of the dichromated hydrophilic colloids.

The amount of latex polymer which is added to the dichromated hydrophilic colloid photosensitive composition varies over a wide range. The latex polymer need only be added in an amount sufficient to improve the resolution of the composition. The exact amount of latex will depend primarily on the amount of hydrophilic colloid present. Usually, the weight ratio of hydrophilic colloid to latex polymer is between 20/1 and 5/1. Particularly preferred weight ratios of hydrophilic colloid to latex polymers are between about 5/1 and 7/1.

The latex copolymer particles are copolymers which conform to the following structure:

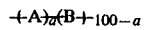

wherein A is a polymerized monomer or monomers having the structure:

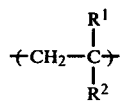

and B is a polymerized monomer or monomers having the structure:

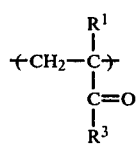

In the formula above, each $R^1$ is independently hydrogen or methyl. $R^2$ is phenyl including substituted phenyl such as tolyl, xylyl, mesityl and the like, or a straight- or branched-chain alkoxycarbonyl group of about 2–8 carbon atoms. Useful alkoxycarbonyl groups include methoxycarbonyl, ethoxycarbonyl, isopropoxycarbonyl, butoxycarbonyl and t-butoxycarbonyl. $R^3$ is $-NR^4R^5$ or $-OR^6$, preferably $-NR^4R^5$. $R^4$ and $R^5$ are independently selected from hydrogen, alkyl of about 1–8 carbon atoms such as methyl, ethyl, isopropyl, tertiary butyl and the like. The term "alkyl" is intended to include substituted and branched-chain alkyl, e.g., isopropyl, isobutyl, t-butyl, sulfamoylbutyl, amidoethyl, hydroxyethyl, phenethyl, chloroethyl, benzyl and 1,1-dimethyl-3-oxobutyl, as well as alkyl containing hetero atoms, e.g., alkoxyalkyl such as ethoxyethyl and isobutoxymethyl; alkylthioalkyl such as 3-thiapentyl; and primary, secondary and tertiary aminoalkyl. Particularly preferred groups for $R^4$ and $R^5$ are substituted alkyl, particularly hydroxy-substituted alkyl and arylalkyl. Useful groups of this type include hydroxyethyl and benzyl. $R^6$ is hydroxyalkyl of about 1–8 carbon atoms such as hydroxyethyl, 2,3-dihydroxypropyl, 4-hydroxybutyl and hydroxymethyl. The weight percent of the hydrophilic monomer, i.e., the monomer which forms water-soluble homopolymers, varies between about 5–25 percent (100 minus a). Where the monomer contains highly solubilizing groups such as hydroxy, weight ratios on the lower end of this range are preferred.

Illustrative useful polymers include poly(styrene-co-acrylamide) (weight ratio 90:10) and poly[styrene-co-N-(isobutoxymethyl)acrylamide] (weight ratio 80:20 or 90:10). The currently preferred polymer latex is the poly(styrene-co-acrylamide) (weight ratio 90:10). The described latices can be made using conventional emulsion polymerization techniques.

The photosensitive compositions of the present invention are coated on any conventional support using known methods. In many embodiments, the photosensitive composition of the present invention is used as a photoresist. Thus, useful supports include metal supports such as copper supports and copper-clad plastic supports which are used in the manufacture of printed circuit boards and the like. In one particularly preferred embodiment, the photosensitive compositions of the present invention are used as the resist in the heat-transfer process for making color filter arrays. In this process, dyes are transferred through window areas which are formed in the photoresist into a dye-receiving layer. The dye-receiving layer is usually a polymeric material, for example, a polyester. The photosensitive compositions of the present invention are particularly useful in this process because they adhere well to the dye receivers used in making the color filter arrays. These compositions adhere particularly well to layers of polyesters such as poly(ethylene terephthalate), polyesters containing gem bivalent groups such as poly(4,4'-hexahydro-4,7-methanoindan-5-ylidenediphenylene terephthalate), and high-temperature-resistant photosensitive polyesters containing gem bivalent groups such as poly[4,4'-(hexahydro-4,7-methanoindan-5-ylidene)-diphenylene terephthalate-co-1,4-phenylenediacrylate] [70:30 m]. Useful heat-transfer processes of this type are described in U.S. Pat. No. 4,081,277 and U.S. Ser. Nos. 913,150 filed June 6, 1978 now U.S. Pat. No. 4,196,010, and 940,057 filed Sept. 6, 1978 now U.S. Pat. No. 4,198,446, the entire disclosures of which are hereby incorporated by reference.

As mentioned above, the compositions of the present invention adhere particularly well to polyesters containing a gem bivalent group. More particularly, these polyesters are comprised of a condensation residue of at least one diol and at least one dicarboxylic acid wherein either the diol or acid contains a saturated gem bivalent linking radical having a saturated polycyclic structure which includes a bicyclic member containing at least one atomic bridge. The atomic bridge optionally contains one or more carbon atoms or a nitrogen or oxygen atom. The cyclic structure optionally contains more than one bridge. Additional saturated rings optionally are fused to the cyclic bridged ring member or joined to the member by spiro-union linkage. Polyesters of this type are well-known in the art and are described, for example, in U.S. Pat. No. 4,097,230 by Sandhu issued June 27, 1978.

In the heat-transfer process for making a solid-state imaging device having a color filter array thereon, the dye-receiving layer, e.g., the polyester layer described above, is provided, such as by coating, on the surface of the device. Optionally, an adhesive layer such as is described in U.S. Ser. No. 884,514 filed Mar. 8, 1978 now abandoned, is coated between the device and the dye-receiving layer. The surface of the device comprises an array of radiation-sensitive solid-state sensors such as charge coupled devices, charge injection devices, bucket brigade devices, diode arrays and the like. Next, a layer comprising a photosensitive composition according to the inventin is coated on the dye-receiving layer and dried. The photosensitive composition is exposed and processed so as to produce window areas which correspond to a set of filter elements in the color filter array. Dye is then heat-transferred into the dye-receiving layer through the window areas. The dye can be transferred by laminating the device with a support which has been coated with dye and then heating the laminate, by immersing the device in a hot solution of dye or by any suitable method. Finally, the remainder of the composition of the present invention is removed from the dye-receiving layer such as by rinsing in a solution of calcium chloride. The described process can be repeated varying the areas exposed and the dyes to produce any number of filter element sets in the dye-receiving layer.

The photosensitive composition of the present invention is also useful in a process wherein dye is transferred through window areas in the photoresist into a dye-receiving layer which comprises a polymer binder and a mordant. A process for making color filter arrays using this method is described in U.S. Ser. No. 867,841 filed Jan. 9, 1978, now U.S. Pat. No. 4,284,866.

In other embodiments, the photosensitive composition of the present invention is used to form the filter elements in the color filter array. In this process, a layer of the radiation-sensitive composition of the present invention is coated on a suitable support and then exposed in a pattern representing a set of filter elements to crosslink or harden those areas. The remainder of the layer is then washed off, usually with water, leaving islands of the original composition. The hardened areas are dyed to produce colored elements and the process is repeated to produce additional sets of dyed elements. In these embodiments, the photosensitive composition of the present invention is most desirably coated directly on the surface of a radiation-sensitive element such as a silver halide element or a solid-state imaging device. The photosensitive compositions of the present invention adhere well to these surfaces and can be dyed by a variety of dyes to produce the desired filter elements. Processes of this type are described, for example, by Friedman, *History of Color Photography*, cited above, in U.S. Pat. No. 3,284,208 by Land, also cited above, and in U.S. Pat. Nos. 3,969,120 issued to Idelson July 13, 1976, 3,519,423 to Sharp issued July 7, 1970, and 3,925,082 to Fielding et al issued Dec. 9, 1975.

The following preparation and examples are presented for a further understanding of the invention and are not intended to limit the scope of the invention in any way.

Preparation 1: Preparation of poly(styrene-co-acrylamide) (weight percent 90:10)

To a 500-mL, 3-necked flask equipped with a stirrer, relfex condenser and an inlet for two addition streams were added 220 mL of distilled water. The distilled water was deoxygenated with nitrogen for 20 min. To the water were added 4.8 mL of a 30% aqueous solution of Aerosol A102 TM available from American Cyanamide Co, Inc, and the temperature of the solution was raised to 60° C. Connected to the inlet for one addition stream was a header which contains 64.8 g of styrene. The other inlet was connected to a header which contains 68 g of deoxygenated distilled water, 7.2 g of acrylamide and 0.48 g of potassium peroxydisulfate.

Just prior to the addition of the two header solutions, 0.24 g of potassium peroxydisulfate and 0.24 g of sodium metabisulfite were added to the flask at 60° C. Immediately after these salts dissolve, the two header solutions were added concurrently to the flask over a period of about 2.5 hr. After the addition of the header tanks to the solution was complete, 2.4 mL of the 30% aqueous solution of Aerosol A102 TM were added to the latex solution and the temperature was maintained at 60° C. for an additional 2 hr. The solution was then cooled and dialyzed to a solution which contains 15.2% solids.

EXAMPLES 1–3: Preparation and use of dichromated gelatin-latex photoresists

A solution was prepared which contained the following:
10 g of a 20% aqueous solution of gelatin denatured to a room-temperature viscosity of 30–50 centipoise;
2 g of a 10% solids dispersion of various polymer latices described in Table 1;
2 g of a 20% aqueous solution of ammonium bichromate.

The resulting photoresist was spin-coated on samples of self-supporting films made from poly(4,4'-hexahydro-4,7-methanoindan-5-ylidenediphenylene terephthalate). The resulting photoresist layer was then exposed to UV light through a resolution test chart, developed by spraying with water and dried by spinning on a spin coater. The dried sample was placed in face-to-face contact with a dye-coated layer and the resulting laminate was heated in order to transfer the dye through the photoresist to the supporting polymer element. The support-photoresist element was delaminated from the dye-coated element and the photoresist was removed by immersing the element in a calcium chloride solution at 100° C. The photoresist was evaluated for adhesion to the polymer support, barrier to the dye, resolution and wash-off properties. The resolution for the various photoresists is given in lines/millimeter. The adhesion, barrier and wash-off properties are subjective measurements made by visual examination and evaluation. The adhesion to the polymer support is self-explanatory. The "barrier to dye" is a subjective evaluation of whether the material is able to prevent the dyeing of the underlying substrate. The wash-off is a judgment of the ease with which the resist can be removed from the polymeric support in the calcium chloride solution. Table 1 presents the results of a variety of experiments using several latex dispersions.

TABLE

| | Latex | Resolution | Adhesion | Barrier to Dye | Wash-Off |
| --- | --- | --- | --- | --- | --- |
| Example | | | | | |
| 1 | poly(styrene-co-acrylamide) (weight ratio 90:10) | 230 | good | excellent | good |
| 2 | poly[styrene-co-N-(isobutoxymethyl)-acrylamide] (weight ratio 90:10) | >100 | good | good | fair |
| 3 | poly[styrene-co-N-(isobutoxymethyl)-acrylamide] (weight ratio 80:20) | >100 | good | good | fair |
| Comparative Examples | | | | | |
| A | poly(styrene-co-acrylamide) (weight ratio 70:30) | — | reticulates | — | — |
| B | poly[styrene-co-N-(isobutoxymethyl)-acrylamide] (weight ratio 70:30) | — | reticulates | accepts some dye | difficult to remove |
| C | poly(methyl methacrylate) | — | hazy film | — | — |
| D | poly(n-butyl methacrylate-co-acrylamido-2-methylpropanesulfonic acid) (weight ratio 90:10) | inadequate | good | good | poor |

The data in the Table demonstrate the superiority of the photosensitive compositions of the present invention over similar compositions. For example, comparative Examples A and B illustrate the difficulties when the amount of solubilizing comonomer is increased over about 25 percent. Comparative Example C illustrates the inferiority of a composition which contains a substantially completely hydrophobic latex. Comparative Example D shows the results of using an ionic solubilizing comonomer instead of those according to the invention. While some of the properties are acceptable, the critical parameter of resolution is not.

EXAMPLE 4

This is a comparative example.

This example illustrates that the use of the compositions of the present invention provides unexpected advantages in comparison with the use of poly(acrylamide) as taught in U.S. Pat. No. 2,687,958.

Poly(acrylamide) (0.5 g) was dissolved in 50 mL water. A solution of 0.5 g of 20% ammonium dichromate in water was added to the poly(acrylamide) solution to form a photosensitive composition.

A layer of the dye-receiving polymer described in Examples 1–3 was spin-coated with the poly(acrylamide)-dichromate solution at 1500 rpm for 60 sec. This coating was then dried by spinning at 6000 rpm for another 60 sec.

The dried sample was imagewise-exposed with a mercury vapor lamp for 30 sec. The sample was then developed under running distilled water for 60 sec and then spin-dried for 60 sec. The poly(acrylamide)-dichromate layer reticulated badly and partially peeled off the dye-receiving layer.

Although the invention has been described in considerable detail with particular reference to certain preferred embodiments thereof, variations and modifications can be effected within the spirit and scope of the invention.

We claim:

1. In a photosensitive composition comprising:
   (a) water,
   (b) a hydrophilic colloid and
   (c) a dichromate photocrosslinking agent,
   the improvement wherein said composition further comprises a copolymer latex wherein the copolymer particles conform to the structure:

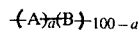

wherein A is a polymerized monomer or monomers having the structure:

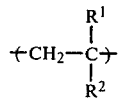

and B is a polymerized monomer or monomers having the structure:

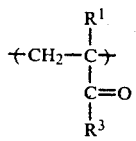

wherein:
   each $R^1$ is independently hydrogen or methyl;
   $R^2$ is phenyl, substituted phenyl or a straight- or branched-chain alkoxycarbonyl group of about 2–8 carbon atoms;
   $R^3$ is $-NR^4R^5$ or $-OR^6$ wherein $R^4$ and $R^5$ are independently selected from hydrogen and alkyl of about 1–8 carbon atoms, and $R^6$ is hydroxyalkyl of about 1–8 carbon atoms; and
   a represents a weight percent of about 75–95.

2. The composition of claim 1 wherein each $R^1$ is hydrogen, $R^2$ is phenyl and $R^3$ is $-NR^4R^5$.

3. The composition of claim 2 wherein $R^4$ is hydrogen or methyl and $R^5$ is hydrogen or alkoxyalkyl.

4. The composition according to claim 1 wherein said copolymer latex is poly(styrene-co-acrylamide) (weight ratio 90:10).

5. The composition according to claim 1 wherein said copolymer is poly[styrene-co-N-(isobutoxymethyl)acrylamide] (weight ratio 80:20 or 90:10).

6. The composition according to claim 1 wherein said hydrophilic colloid is gelatin.

7. The composition according to claim 1 wherein the weight ratio of hydrophilic colloid to latex copolymer is between about 15/1 and 7/1.

8. In an article comprising a polyester layer having coated thereon a layer of a photosensitive composition comprising:
   (a) a hydrophilic colloid and
   (b) a dichromate photocrosslinking agent,
   the improvement wherein said composition further comprises a copolymer latex wherein the copolymer particles conform to the structure:

wherein A is a polymerized monomer or monomers having the structure:

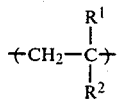

and B is a polymerized monomer or monomers having the structure:

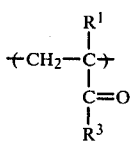

wherein
   each $R^1$ is independently hydrogen or methyl;
   $R^2$ is phenyl, substituted phenyl or a straight- or branched-chain alkoxycarbonyl group of about 2–8 carbon atoms;
   $R^3$ is $-NR^4R^5$ or $-OR^6$ wherein $R^4$ and $R^5$ are independently selected from hydrogen, alkyl of about 1–8 carbon atoms including substituted alkyl, and alkyl containing hetero atoms in the alkyl chain, and $R^6$ is hydroxyalkyl of about 1–8 carbon atoms; and
   a represents a weight percent of about 75–95.

9. The article of claim 8 wherein said polyester comprises a condensation residue of at least one diol and at least one dicarboxylic acid wherein either the diol or acid contains a saturated gem-bivalent linking radical having a saturated polycyclic structure which includes a bicyclic member containing at least one atomic bridge.

10. The article of claim 8 wherein said polyester layer is self-supporting.

11. The article of claim 8 wherein said polyester layer is coated on a solid-state imaging device.

12. The article of claim 8 wherein each $R^1$ is hydrogen, $R^2$ is phenyl and $R^3$ is $-NR^4R^5$.

13. The article of claim 8 wherein $R^4$ is hydrogen or methyl and $R^5$ is hydrogen or alkoxyalkyl.

14. The article of claim 8 wherein said copolymer latex is poly(styrene-co-acrylamide) (weight ratio 90:10).

15. The article of claim 8 wherein said copolymer is poly[styrene-co-N-(isobutoxymethyl)acrylamide] (weight ratio 80:20 or 90:10).

16. The article of claim 8 wherein said hydrophilic colloid is gelatin.

17. The article of claim 8 wherein the weight ratio of hydrophilic colloid to latex copolymer is between about 15/1 and 7/1.

18. A process for making a solid-state imaging device having thereon a color filter array in a dye-receiving layer, said process comprising the steps of:
    (a) coating a photosensitive composition on said dye-receiving layer, said composition comprising:
       (i) water, (ii) a hydrophilic colloid,
(iii) a dichromate photocrosslinking agent and
(iv) a copolymer latex wherein the copolymer particles conform to the structure:

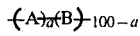

wherein A is a polymerized monomer or monomers having the structure:

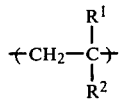

and B is a polymerized monomer or monomers having the structure:

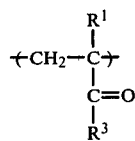

wherein:

each $R^1$ is independently hydrogen or methyl;

$R^2$ is phenyl, substituted phenyl or a straight- or branched-chain alkoxycarbonyl group of about 2–8 carbon atoms;

$R^3$ is $-NR^4R^5$ or $-OR^6$ wherein $R^4$ and $R^5$ are independently selected from hydrogen, alkyl of about 1–8 carbon atoms including substituted alkyl, and alkyl containing hereto atoms in the alkyl chain, and $R^6$ is hydroxyalkyl of about 1–8 carbon atoms; and a represents a weight percent of about 75–95; and drying said composition;

(b) exposing and processing said photosensitive composition so as to produce window areas which correspond to a set of filter elements to be formed in said color filter array;

(c) heat-transferring dye into said dye receiver through said window areas; and (d) removing the remainder of said photosensitive composition.

19. The process according to claim 18 wherein steps (a)–(d) are carried out three times so as to produce a solid-state imaging device having a three-color filter array thereon.

* * * * *

UNITED STATES PATENT AND TRADEMARK OFFICE
CERTIFICATE OF CORRECTION

PATENT NO. : 4,264,706

DATED : April 28, 1981

INVENTOR(S) : Richard C. Sutton & Thomas W. Martin

It is certified that error appears in the above-identified patent and that said Letters Patent are hereby corrected as shown below:

Column 12, line 9, "hereto" should be --hetero--.

Signed and Sealed this

Twenty-first Day of July 1981

[SEAL]

Attest:

GERALD J. MOSSINGHOFF

Attesting Officer

Commissioner of Patents and Trademarks